US 6,700,424 B2

(12) United States Patent
Feng

(10) Patent No.: US 6,700,424 B2
(45) Date of Patent: Mar. 2, 2004

(54) MULTIPLE-CHANNEL OPTICAL TRANSCEIVER INPUT BUFFER WITH ZERO STATIC CURRENT AND SYMMETRICAL HYSTERESIS

(75) Inventor: Kai Di Feng, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/682,044

(22) Filed: Jul. 13, 2001

(65) Prior Publication Data
US 2002/0057120 A1 May 16, 2002

(30) Foreign Application Priority Data
Nov. 10, 2000  (CA) .............................................. 2325685

(51) Int. Cl.[7] .......................... H03K 3/037; H03K 3/12; H03K 3/286; H03K 3/356
(52) U.S. Cl. .......................... 327/206; 327/108; 326/83
(58) Field of Search ........................ 327/108–112, 205, 327/206, 143, 389, 391, 581; 326/83, 27; 359/152

(56) References Cited

U.S. PATENT DOCUMENTS

| 3,984,703 A | * | 10/1976 | Jorgensen | 327/206 |
| 5,874,844 A | * | 2/1999 | Shin | 327/206 |
| 5,945,859 A | * | 8/1999 | Pang | 327/206 |
| 6,124,733 A | * | 9/2000 | Sharpe-Geisler | 326/83 |

FOREIGN PATENT DOCUMENTS

WO  WO 99/50961  * 10/1999

* cited by examiner

Primary Examiner—Long Nguyen
(74) Attorney, Agent, or Firm—Anthony J. Canale; Robert A. Walsh

(57) ABSTRACT

An input buffer for an optical receiver or transceiver which provides symmetrical hysteresis and zero static current, comprises two field effect transistors (FETs) which form the basic buffer logic circuit, two FETs which respectively provide offset voltages to the buffer logic FETs, and two FETs which provide positive feedback. In the preferred embodiment the input buffer provides multiple-channels, each channel comprising a component inverter designed to provide zero static current and symmetrical hysteresis for a different input signal mode.

17 Claims, 3 Drawing Sheets

MULTIPLE-CHANNEL OPTICAL TRANSCEIVER INPUT BUFFER WITH ZERO STATIC CURRENT AND SYMMETRICAL HYSTERESIS

BACKGROUND OF THE INVENTION

1. Field of the Invention

This invention relates to optical transceivers. In particular, this invention relates to an optical transceiver and input buffer therefor, especially suitable for use in infrared transceiver systems.

2. Background of the Invention

An optical receiver converts optical pulses to corresponding electrical signals. For example, the optical receiver in an infrared (IR) optical transceiver commonly used for wireless data transfer typically utilizes an IR-sensitive diode which emits an electric current in proportion to the intensity of infrared light striking the active area of the diode. An optical transmitter of an optical transceiver sends out optical pulses according to the input electrical signal applied on the input buffer.

The input buffer of an IR transceiver is an inverter which has certain desirable characteristics:

1. Hysteresis: Hysteresis is necessary to improve the system noise immunity and input signal stability. Ideally an IR transceiver input buffer input-output characteristics should exhibit symmetrical hysteresis, wherein the up-threshold and down-threshold are symmetrical about the pulse width definition point, usually taken as one half of the power supply voltage. This is especially important to the input of the transceiver, which should maintain the output pulse width the same as the input pulse.
2. Zero static current: Zero static current for both logic high and logic low states is highly desirable. It is required in certain situations, for example by the active high input signal of SD (shut down) mode, because when an IR transceiver is in shut down mode the transceiver power current can be as low as 50 nanoamperes, and thus an input buffer current on the order of microamperes is unacceptable and unworkable.
3. Multi-channel: The buffer should have the capability of interfacing with different input signal modes such as TTL, 5V CMOS, 3.3V CMOS, 2.7V CMOS and so on, each of which has a different voltage swing and thus requires a different threshold voltage.
4. Automatic pull down: When a mechanical switch is connected to the input buffer the input pin may be floating electrically, which would cause uncertainty in the logic status. The input buffer should have the capability of detecting the floating condition during power on reset and automatically pull down the input to a logic low status.

There are two conventional prior art input buffers. FIG. 1 shows a CMOS inverter, which has zero static current but has no hysteresis. FIG. 2 shows a source coupling input buffer, which has hysteresis but its static current is not zero because one of the FETs U1 or U2 is always turned on.

BRIEF SUMMARY OF THE INVENTION

The present invention addresses these problems by providing an input buffer circuit for an optical transceiver which provides symmetrical hysteresis and zero static current. The input buffer comprises two field effect transistors (FETs) which form the basic buffer logic circuit, two FETs which respectively provide offset voltages to the buffer logic FETs, and two FETs which provide positive feedback.

In the preferred embodiment the input buffer of the invention is programmable, providing multiple-channels, each channel comprising a component inverter designed to provide zero static current and symmetrical hysteresis for a different input signal mode. The multi-channel input buffer of the invention, which can be embodied in a single microchip, can thus accommodate input signals having different characteristics without sacrificing the symmetrical hysteresis of the output signal.

The present invention thus provides a multiple-channel input buffer circuit, comprising a pair of logic transistors comprising a p-type transistor coupled in series, drain to drain, with an n-type transistor, a pair of voltage offset transistors comprising a p-type transistor having a drain coupled to a source of the p-type logic transistor and a source coupled to a power supply and an n-type transistor having a drain coupled to a source of the n-type logic transistor and a source coupled to ground, an input terminal coupled to gates of the logic and voltage offset transistors, and a plurality of pairs of feedback transistors, each pair of feedback transistors comprising a p-type transistor having a source coupled to a junction of the p-type logic and voltage offset transistors, a gate coupled to an output terminal and a drain coupled to ground through a switching circuit and an n-type transistor having a source coupled to a junction of the n-type logic and voltage offset transistors, a gate coupled to the output terminal and a drain coupled to a voltage supply through the switching circuit, wherein when the switching circuit associated with a pair of feedback transistors is activated, the feedback transistors supply a positive feedback to control a conductivity of the logic transistors and vary a voltage level on the output terminal.

The present invention further provides an optical transceiver having an input buffer circuit, the input buffer circuit comprising a pair of logic transistors comprising a p-type transistor coupled in series, drain to drain, with an n-type transistor, a pair of voltage offset transistors comprising a p-type transistor having a drain coupled to a source of the p-type logic transistor and a source coupled to a power supply and an n-type transistor having a drain coupled to a source of the n-type logic transistor and a source coupled to ground, an input terminal coupled to gates of the logic and voltage offset transistors, and a plurality of pairs of feedback transistors, each pair of feedback transistors comprising a p-type transistor having a source coupled to a junction of the p-type logic and voltage offset transistors, a gate coupled to an output terminal and a drain coupled to ground through a switching circuit and an n-type transistor having a source coupled to a junction of the n-type logic and voltage offset transistors, a gate coupled to the output terminal and a drain coupled to a voltage supply through the switching circuit, wherein when the switching circuit associated with a pair of feedback transistors is activated, the feedback transistors supply a positive feedback to control a conductivity of the logic transistors and vary a voltage level on the output terminal.

In further aspects of the multiple-channel input buffer circuit and the optical transceiver of the invention: the input terminal is coupled to a pull down circuit; the pull down circuit comprises a resistance path to ground through a switch and a resistor, and an inverter having an inverter input coupled to the input terminal and an inverter output coupled to the switch, wherein when the input is low or floating the inverter output renders the switch conductive to close the path to ground to ground the input through the resistor; the pull down circuit comprises a second resistance path to ground through a second switch, the second switch being rendered conductive by a power on reset signal; each switching circuit comprises a switching terminal connected to an n-type transistor and connected through an inverter to a p-type transistor, whereby a high logic signal applied to the switching terminal closes respective paths between the feedback transistors and power terminals supplying power to the circuit; and/or the transistors are field effect transistors.

The present invention further provides an input buffer circuit comprising a pair of logic transistors comprising a p-type transistor coupled in series, drain to drain, with an n-type transistor, a pair of voltage offset transistors comprising a p-type transistor having a drain coupled to a source of the p-type logic transistor and a source coupled to a power supply and an n-type transistor having a drain coupled to a source of the n-type logic transistor and a source coupled to ground, an input terminal coupled to gates of the logic and voltage offset transistors, and a pair of feedback transistors comprising a p-type transistor having a source coupled to a junction of the p-type logic and voltage offset transistors, a gate coupled to an output terminal and a drain coupled to ground and an n-type transistor having a source coupled to a junction of the n-type logic and voltage offset transistors, a gate coupled to the output terminal and a drain coupled to a voltage supply, wherein the feedback transistors are respectively selected according to the formulae:

$$Idsp=Gp*[(Va+Vthp)2]*Wp/(2*Lp)$$

and $$Idsn=Gn*[(VDD-Vb-Vthn)2]*Wn/(2*Ln)$$

where:
Idsp=the drain-to-source current of the p-type feedback transistor,
Vthp=threshold voltage of the p-type feedback transistor,
Wp=channel width of the p-type feedback transistor,
Lp=channel length of the p-type feedback transistor,
Va=the voltage at the source of the p-type feedback transistor,
Gp=the transconductance of the p-type feedback transistor,
Idsn=the drain-to-source current of the n-type feedback transistor,
Vthn=threshold voltage of the n-type feedback transistor,
Wn=channel width of the n-type feedback transistor,
Ln=channel length of the n-type feedback transistor,
Vb=the voltage at the source of the n-type feedback transistor, and
Gn=the transconductance of the n-type feedback transistor,
to independently determine an up threshold and a down threshold of the input buffer circuit and thereby to provide an output signal having symmetrical hysteresis.

In further aspects of the input buffer circuit of the invention: the pull down circuit comprises a resistance path to ground through a switch and a resistor, and an inverter having an inverter input coupled to the input terminal and an inverter output coupled to the switch, wherein when the input is low or floating the inverter output renders the switch conductive to close the path to ground to ground the input through the resistor; the pull down circuit comprises a second resistance path to ground through a second switch, the second switch being rendered conductive by a power on reset signal; the transistors are field effect transistors; the circuit comprises a plurality of pairs of feedback transistors, each p-type feedback transistor having a drain coupled to ground through a switching circuit and each n-type feedback transistor having a drain coupled to the power supply through the switching circuit, wherein when the switching circuit associated with a pair of feedback transistors is activated the feedback transistors supply a positive feedback to control a conductivity of the logic transistors and vary a voltage level on the output terminal; and/or each switching circuit comprises a switching terminal connected to an n-type transistor and connected through an inverter to a p-type transistor, whereby a high logic signal applied to the switching terminal closes respective paths between the feedback transistors and power terminals supplying power to the circuit.

BRIEF DESCRIPTION OF THE SEVERAL VIEWS OF THE DRAWINGS

In drawings which illustrate by way of example only a preferred embodiment of the invention.

DETAILED DESCRIPTION OF THE INVENTION

Figure 1:
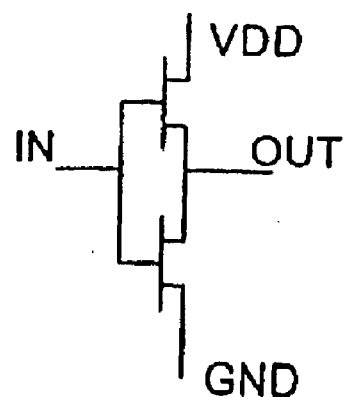
FIG. 1 is a circuit diagram of a prior art CMOS input buffer.
Figure 2:
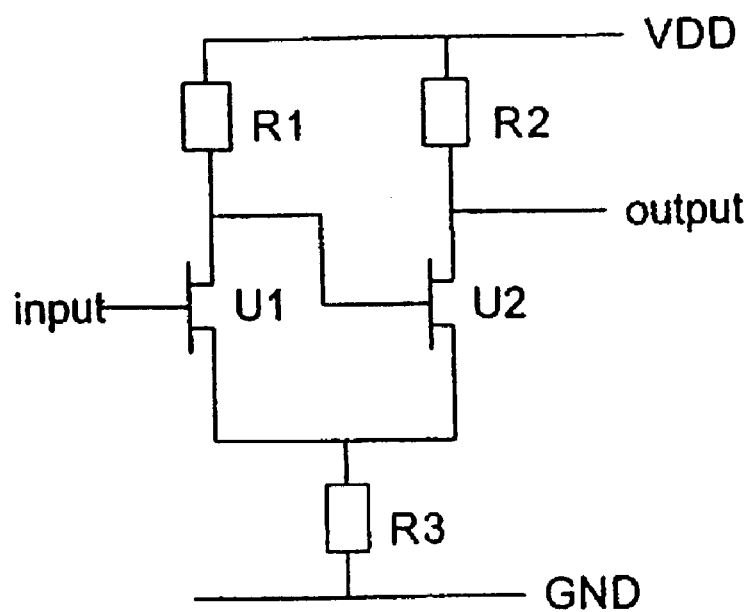
FIG. 2 is a circuit diagram of a prior art source coupling input buffer.
Figure 3:
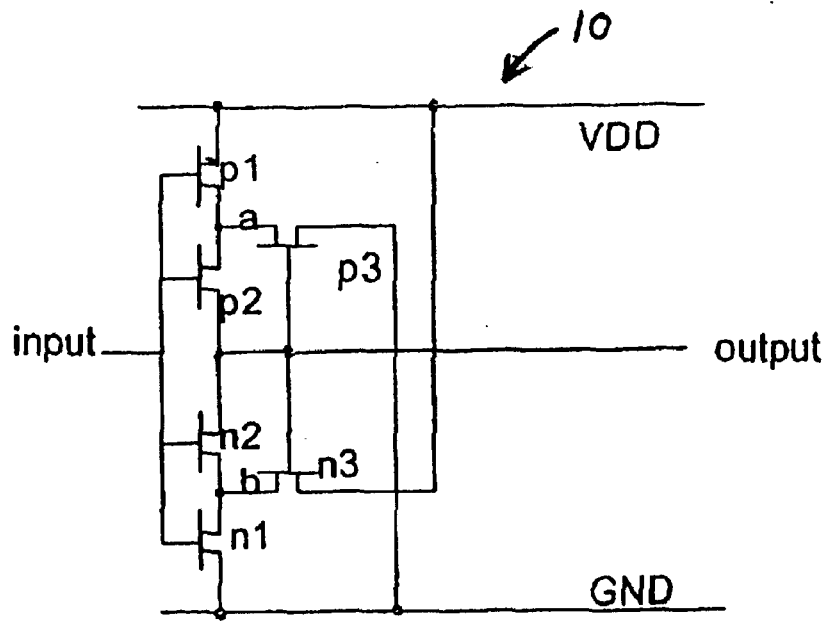
FIG. 3 is a circuit diagram of a preferred embodiment of a component inverter having zero static current and symmetrical hysteresis.

A preferred embodiment of a component inverter 10 is illustrated in FIG. 3. The circuit illustrated uses two power terminals $V_{DD}$ and ground (GND), however it will be appreciated that the ground terminal may have a voltage higher or lower than 0 volts as long as there is a suitable voltage difference between the power terminals.

The component inverter 10 comprises six transistors, in the preferred embodiment field effect transistors (FETs) p1, p2, p3 and n1, n2, n3. FETs p1, p2, p3 are p-type field effect transistors and FETs n1, n2, n3 are n-type field effect transistors. A pair of logic FETs p2 and n2 provide the buffer logic, while the pair of voltage offset FETs p1 and n1 provide offset voltages to FETs p2 and n2, respectively. A pair of feedback FETs p3 and n3 provide positive feedback to the logic FETs p2, n2, as described below.

FETs p1 and p2 are coupled in series, the drain of p1 being coupled to the source of p2. The source of p3 is coupled to the junction of FETs p1 and p2. The gate of p3 is coupled to the buffer output, and the drain of p3 is coupled to ground. Likewise, FETs n1 and n2 are coupled in series, the drain of n1 being coupled to the source of n2. The drain of n3 is coupled to the junction of FETs n1 and n2. The gate of n3 is coupled to the buffer output, and the drain of n3 is connected to the supply voltage. The input signal is applied to the gates of p1, p2, n1 and n2.

When the input signal is in the logic state low, FETs p1, p2 and n3 are turned on, but FETs n1, n2 and p3 are turned off so that the $V_{DD}$ current is zero. When the input is in the logic state high, FETs n1, n2 and p3 are turned on, but FETs p1, p2 and n3 are turned off so that the $V_{DD}$ current is zero. Therefore, the component inverter 10 shown in FIG. 3 meets the requirement of zero static current at both high and low logic states.

The hysteresis characteristics of the component inverter 10 involve the following voltage thresholds:

1) Up Threshold (Vthup): The input voltage Vin which, as the voltage of the input signal increases from ground, causes the transition on the output from logic high to logic low;

2) Down Threshold (Vthdown): The input voltage Vin which, as the voltage of the input signal decreases from VDD, causes the transition on the output from logic low to logic high.

Up Threshold Vthup

To be turned on, n2 requires a higher input voltage Vin than n1, because of the n2 source offset voltage Vb (i.e. the voltage at the junction of FETs n1 and n2) and the body effect. The offset voltage Vb is determined by FETs n1 and n3. Similarly, p2 requires a lower input voltage Vin to be turned on than p1, because of the p2 source offset voltage Va (i.e. the voltage at the junction of FETs p1 and p2) and the body effect. The offset voltage Va is determined by FETs p1 and p3.

When n2 is turned off and the output is in the logic high state, the current through n1 is equal to the current through n3:

$$Isdn1 = Isdn3 \qquad (1)$$

When p2 is turned off and the output is in the logic low state, the current through p1 is equal to the current through p3:

$$Isdp1 = Isdp3 \qquad (2)$$

According to the preferred embodiment of the invention, FETs n1, n2 and n3 are each the same type of n-FET with a threshold voltage Vthn at zero source-substrate voltage, body effect constant Rn and a transconductance Gn. FETs p1, p2 and p3 are each same type of p-FET with a threshold voltage Vthp at zero source-VDD voltage, body effect constant Rp and transconductance Gp.

As the input signal voltage Vin starts increasing from zero, the gate voltage of n1 increases. When Vin reaches the threshold Vthn of n1, n1 is turned on but the output voltage Vout is still in the logic high state because n2 remains turned off. When Vin reaches the up-threshold voltage Vthup, n2 starts turning on. This generates a positive feedback, because when n2 turns on the output voltage Vout drops and the current through n3 decreases, so Vb decreases and n2 becomes more conductive; the output voltage Vout continues to drop until p3 turns on, at which point Va drops and p2 becomes less conductive, further decreasing the output voltage Vout, etc. This positive feedback mechanism or "avalanche" results in the output changing to the logic low state.

To obtain symmetrical hysteresis, the up threshold Vthup is determined by the following equations:

$$Vthn2 = Vthn + (Vb)0.5 \qquad (3)$$

$$Vthup = Vthn2 + Vb \qquad (4)$$

$$Idsn1 = Gn*[(Vthup-Vthn)*Vb-(Vb)2/2]*Wn1/Ln1 \text{ if } 0<Vb<(Vthup-Vthn) \qquad (5)$$

or $$Idsn1 = [Gn*(Vthup-Vthn)2]*Wn1/(2*Ln1) \text{ if } 0<(Vthup-Vthn)<Vb \qquad (6)$$

$$Vthn3 = Vthn + (Vb)0.5 \qquad (7)$$

$$Idsn3 = Gn*[(VDD-Vb-Vthn3)2]*Wn3/(2*Ln3) \qquad (8)$$

$$Idsn1 = Idsn3 \qquad (9)$$

where:

Vthn2=threshold voltage of n2 including body effect,
Vb=the voltage at the source of n3,
Idsn3=the drain-to-source current of n3,
Idsn1=the drain-to-source current of n1,
Wn1=channel width of n1,
Ln1=channel length of n1,
Vthn3=threshold voltage of n3 including body effect,
Wn3=channel width of n3, and
Ln3=channel length of n3.

Down Threshold Vthdown

As the input voltage starts decreasing from VDD, when it reaches the threshold Vthp1 of p1, p1 is turned on but the output voltage is still in the logic low state because p2 remains off. When Vin reaches the down threshold voltage Vthdown, p2 starts turning on. This generates a positive feedback, because when p2 is turned on the output voltage Vout increases and the current through p3 decreases, so Va increases and p2 becomes more conductive; the output voltage Vout continues to increase until n3 turns on, so that Vb increases, n2 becomes less conductive and the output voltage Vout increases, etc. This positive feedback mechanism or avalanche results in the output changing to the logic high state.

To obtain symmetrical hysteresis, the down threshold Vthdown is determined by the following equations:

$$Vthp2 = Vthp - (VDD-Va)0.5 \qquad (10)$$

$$Vthdown = Vthp2 + Va \qquad (11)$$

$$Vgsp1 = Vthdown - VDD \qquad (12)$$

$$Vdsp1 = Va - VDD \qquad (13)$$

$$Idsp1 = Gp*[(Vthdown-VDD-Vthp)*Vdsp1-(Vdsp1)2/2]*Wp1/Lp1 \text{ if } 0>Vdsp1>(Vgsp1-Vthp1) \qquad (14)$$

or $$Idsp1 = [Gp*(Vgsp1-Vthp)2]*Wn1/(2*Ln1) \text{ if } 0>(Vgsp1-Vthp)>Vdsp1 \qquad (15)$$

$$Vthp3 = Vthp - (VDD-Va)0.5 \qquad (16)$$

$$Idsp3 = Gp*[(Va+Vthp3)2]*Wp3/(2*Lp3) \qquad (17)$$

$$Idsp1 = Idsp3 \qquad (18)$$

where: Vthp2=threshold voltage of p2 including body effect,
Vdsp1=the drain-to-source voltage of p1,
Vgsp1=the gate-to-source voltage of p1,
Va=the voltage at the source of p3,
Idsp3=the drain-to-source current of p3,
Idsp1=the drain-to-source current of p1,
Wp1=channel width of p1,
Lp1=channel length of p1,
Vthp3=threshold voltage of p3 including body effect, Wp3=channel width of p3, and Lp3=channel length of p3.

Thus, while there is no explicit expression of Vthup and Vthdown, the numerical values of the thresholds Vthup and Vthdown can be obtained using equations (3) to (9) and (10) to (18), respectively. Because Vthup and Vthdown are independent, they can be selected to be symmetrical about the pulse width definition point, for example one half of VDD, to provide symmetrical hysteresis in the component inverter 10 of the invention. These calculations can be performed by Maple (trademark), Matcad (trademark) or other commercially available computer programs.

Figure 4:
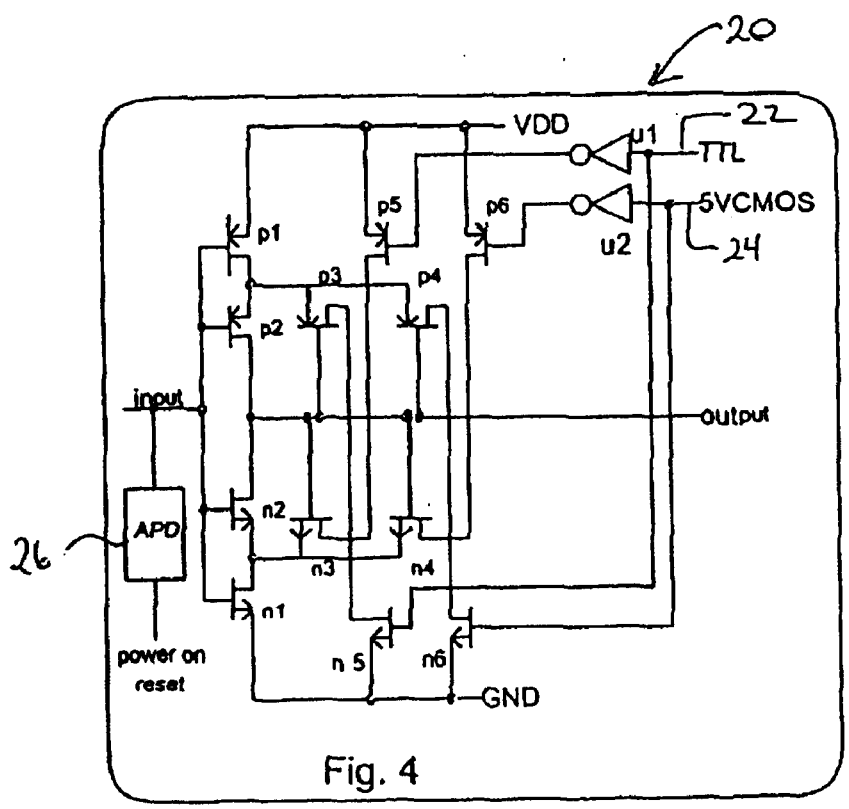
FIG. 4 is a circuit diagram of a multi-channel input buffer according to the invention utilizing the component inverter of FIG. 3.

As there are many different types of circuits used in optical transceiver systems, for example TTL, 5VCMOS, 3.3VCMOS, 2.7VCMOS and mechanical switches, and each circuit type has a different threshold voltage, in the preferred embodiment the input buffer of the invention is programmable and provides multiple channels. As illustrated in FIG. 4, each channel comprises a component inverter 10 designed to provide symmetrical hysteresis for a different input signal mode.

FIG. 4 illustrates a two-channel programmable embodiment of the input buffer 20 of the invention, in which FET pairs p1, n1 and p2, n2 are common to all channels and function as described above in relation to the component inverter 10 of FIG. 3. Feedback FETs p3 and n3 are dedicated to the first channel, for example designed for a TTL circuit, and feedback FETs p4 and n4 are dedicated to the second channel, for example designed for a 5VCMOS circuit. The feedback FETs p3, n3 or p4, n4 operate independently in the manner described above in relation to the component inverter 10, the channel being selected depending upon the environment of the circuit.

The TTL channel is activated by a switching circuit, in the preferred embodiment comprising a pair of n-type and p-type FETs controlled by a switching signal applied directly to the gate of the n-type FET and to an inverter which simultaneously applies a complement signal to the gate of the associated p-type FET in the pair. For example, a logic high signal applied to the TTL pin 22 is passed to the gate of n-type FET n5 to render n5 conductive, which in turn grounds the drain of p3; and at the same time the logic high signal is applied to the input of inverter U1, which thus applies a logic low signal to the gate of p-type FET p5 to render p5 conductive and pass the supply voltage VDD to the drain of n3. The feedback transistors p3, n3 generate a positive feedback in the manner described above, the hysteresis characteristics of which are determined by the up- and down-thresholds Vthup and Vthdown, which are in turn determined by the selected threshold voltages Vthp, Vthn, body effect constants Rp, Rn, and transconductances Gp, Gn of feedback transistors p3 and n3, respectively, for example according to equations (3) to (18). The 5VCMOS channel remains inactive because, with the 5VCMOS terminal in a logic low state, the logic low signal is applied to the gate of n-type FET n6 and the inverter U2 applies a logic high voltage to the gate of p-type FET p6, so that both p6 and n6 remain off.

To use the input buffer 20 in a 5VCMOS circuit, the 5VCMOS channel is activated by applying a logic high signal to the 5VCMOS pin 24, which is passed to the gate of n-type FET n6 to render n6 conductive, which in turn grounds the drain of p4; at the same time the logic high signal is applied to the input of inverter U2, which thus applies a logic low signal to the gate of p-type FET p6 to render p6 conductive and pass the supply voltage VDD to the drain of n4. The feedback transistors p4, n4 generate a positive feedback in the same fashion as feedback transistors p3, n3 of the TTL channel, and as in the case of p3, n3 the hysteresis characteristics of p4, n4 are determined by the selected threshold voltages Vthp, Vthn, body effect constants Rp, Rn, and transconductances Gp, Gn of feedback transistors p4 and n4, respectively. The TTL channel remains inactive with the TTL terminal in a logic low state, because the logic low signal is applied to the gate of n-type FET n5 and the inverter U2 applies a logic high voltage to the gate of p-type FET p5, so that both p5 and n5 remain off.

In a preferred embodiment for use with mechanical switches and relays, the input buffer 20 further includes an automatic pull down circuit (APD) 26. When the mechanical contact is off, the input of the input buffer 20 is at floating potential and the voltage on the input is uncertain. This can cause the logic state of the output to fluctuate randomly, which is unacceptable in most applications. One solution is to add a pull up resistor or pull down resistor to the input pin, however this results in a continuous current when the mechanical contact is on, which is also unacceptable.

Figure 5:
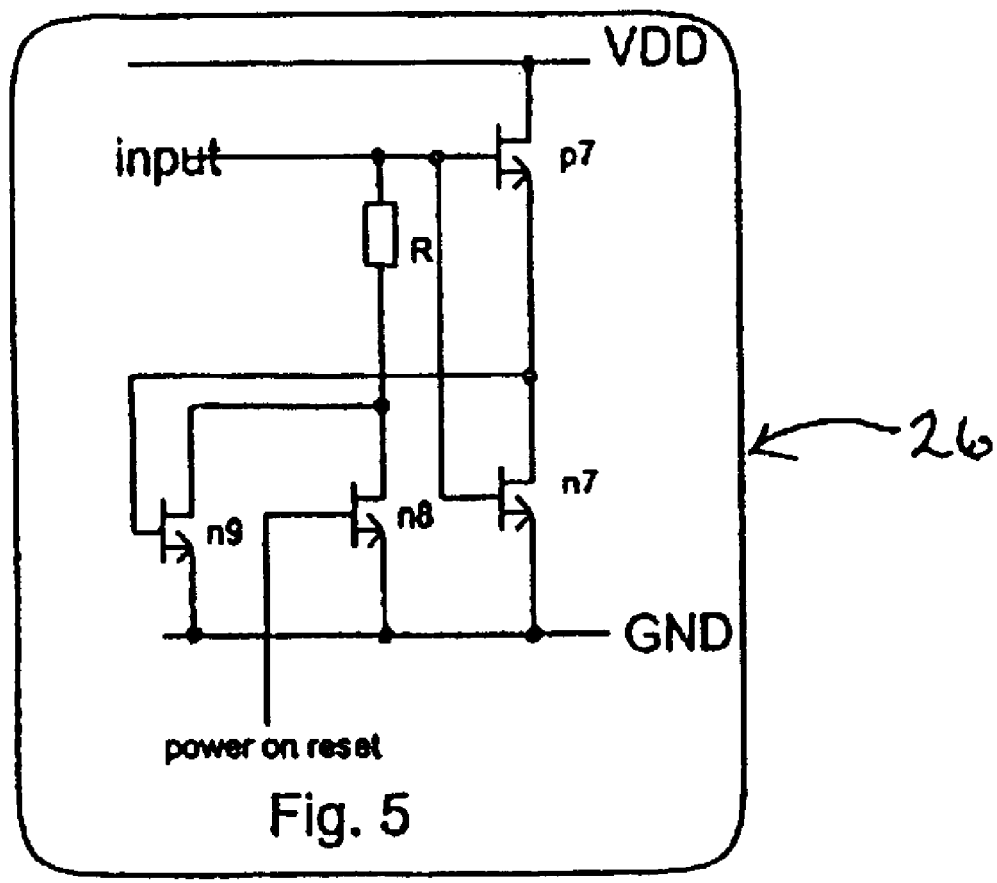
FIG. 5 is a circuit diagram of a preferred embodiment of an automatic pull down circuit for the multi-channel input buffer of FIG. 4.

FIG. 5 illustrates an automatic pull down circuit 26 which cuts off the current whenever the input buffer 20 input is floating or at a logic low level. In the APD illustrated, p-type FET p7 and n-type FET n7 form an inverter. During system power on reset, a positive pulse is applied to the gate of FET n8 to turn n8 on, so that the input pin is pulled down to ground through resistor R and n8. If the input pin is floating or the input signal applied to the input pin is at a low logic level, the input of the inverter p7-n7 is at a logic low level so the inverter output is at a logic high level which is applied to the gate of n-type FET n9 to turn n9 on.

If the input pin is connected to a floating potential externally, the input pin will retain the logic low level when the system power on reset is complete so that the signal power on reset goes to logic level low, n8 is turned off because n9 is turned on so the gate-to-drain voltage of n8 is zero, and the input pin is pulled down to ground through resistor R and n9. Thus, no current flows through R whether the input pin is floating or connected to a logic low signal.

If the input signal applied to the input pin is at logic level high, the output of the inverter p7-n7 is at a logic level low and n9 is turned off. When the system power on reset is complete, n8 is also turned off. Therefore, no current flows through R.

The multi-channel input buffer 20 of the invention can be embodied in a single microchip, and can have up to ten channels, to thus accommodate input signals having different characteristics while still exhibiting zero static current and symmetrical hysteresis of the output signal. The input buffer 20 of the invention can thus be used for many different types of circuits, including circuits using mechanical switches or relays, and is programmable or, with suitable adaptation, intelligent for automatic selection of the appropriate component inverter to suit the environment.

A preferred embodiment of the invention having been thus described by way of example, it will be apparent to those skilled in the art that certain modifications and adaptations may be made without departing from the scope of the invention. The invention is intended to include all such modifications and adaptations as fall within the scope of the claims.

What is claimed is:

1. A multiple-channel input buffer circuit, comprising:
   a pair of logic transistors comprising a p-type transistor coupled in series, drain to drain, with an n-type transistor,
   a pair of voltage offset transistors comprising a p-type transistor having a drain coupled to a source of the p-type logic transistor and a source coupled to a power supply, and an n-type transistor having a drain coupled to a source of the n-type logic transistor and a source coupled to ground, an input terminal coupled to gates of the logic and voltage offset transistors, and a plurality of pairs of feedback transistors, each pair of feedback transistors comprising a p-type transistor having a source coupled to a junction of the p-type logic and voltage offset transistors, a gate coupled to an output terminal and a drain coupled to ground through a switching circuit, and an n-type transistor having a source coupled to a junction of the n-type logic and voltage offset transistors, a gate coupled to the output terminal and a drain coupled to the power supply through the switching circuit, wherein when the switching circuit associated with a pair of feedback transistors is activated, the respective pair of feedback transistors supply a positive feedback to control a conductivity of the logic transistors and vary a voltage level on the output terminal.

2. The input buffer circuit of claim 1, wherein the input terminal is coupled to a pull down circuit.

3. The input buffer circuit of claim 2, wherein the pull down circuit comprises a resistance path to ground through a switch and a resistor, and an inverter having an inverter input coupled to the input terminal and an inverter output coupled to the switch, wherein when the input terminal is low or floating the inverter output renders the switch conductive to close the path to ground to ground the input terminal.

4. The input buffer circuit of claim 3, wherein the pull down circuit further comprises a second resistance path to ground through a second switch, the second switch being rendered conductive by a power on reset signal.

5. The input buffer circuit of claim 2, wherein each switching circuit comprises a switching terminal connected to an n-type transistor and connected through an inverter to a p-type transistor, whereby a high logic signal applied to the switching terminal closes respective paths between the feedback transistors and power terminals supplying power to the input buffer circuit.

6. The input buffer circuit of claim 5, wherein all the transistors of the input buffer circuit are field effect transistors.

7. An optical transceiver having an input buffer circuit, the input buffer circuit comprising:

a pair of logic transistors comprising a p-type transistor coupled in series, drain to drain, with an n-type transistor;

a pair of voltage offset transistors comprising a p-type transistor having a drain coupled to a source of the p-type logic transistor and a source coupled to a power supply, and an n-type transistor having a drain coupled to a source of the n-type logic transistor and a source coupled to ground;

an input terminal coupled to gates of the logic and voltage offset transistors, and a plurality of pairs of feedback transistors, each pair of feedback transistors comprising a p-type transistor having a source coupled to a junction of the p-type logic and voltage offset transistors, a gate coupled to an output terminal and a drain coupled to ground through a switching circuit, and an n-type transistor having a source coupled to a junction of the n-type logic and voltage offset transistors, a gate coupled to the output terminal and a drain coupled to the power supply through the switching circuit, wherein when the switching circuit associated with the respective pair of feedback transistors is activated, the respective pair of feedback transistors supply a positive feedback to control a conductivity of the logic transistors and vary a voltage level on the output terminal.

8. The optical transceiver of claim 7, wherein the input terminal of the input buffer circuit is coupled to a pull down circuit.

9. The optical transceiver of claim 8, wherein the pull down circuit comprises a resistance path to ground through a switch and a resistor, and an inverter having an inverter input coupled to the input terminal and an inverter output coupled to the switch, wherein when the input terminal is low or floating the inverter output renders the switch conductive to close the path to ground to ground the input terminal through the resistor.

10. The optical transceiver of claim 9, wherein the pull down circuit further comprises a second resistance path to ground through a second switch, the second switch being rendered conductive by a power on reset signal.

11. The optical transceiver of claim 8, wherein each switching circuit comprises a switching terminal connected to an n-type transistor and connected through an inverter to a p-type transistor, whereby a high logic signal applied to the switching terminal closes respective paths between the feedback transistors and power terminals supplying power to the input buffer circuit.

12. The optical transceiver of claim 11, wherein all the transistors of the input buffer circuit are field effect transistors.

13. An input buffer circuit comprising:

a pair of logic transistors comprising a p-type transistor coupled in series, drain to drain, with an n-type transistor, a pair of voltage offset transistors comprising a p-type transistor having a drain coupled to a source of the p-type logic transistor and a source coupled to a power supply, and an n-type transistor having a drain coupled to a source of the n-type logic transistor and a source coupled to ground, an input terminal coupled to gates of the logic and voltage offset transistors, and to a pull down circuit, wherein the pull down circuit comprises a resistance path to ground through a switch and a resistor, and an inverter having an inverter input coupled to the input terminal and an inverter output coupled to the switch, wherein when the input terminal is low or floating the inverter output renders the switch conductive to close the path to ground to ground the input terminal through the resistor, and a pair of feedback transistors comprising a p-type transistor having a source coupled to a junction of the p-type logic and voltage offset transistors, a gate coupled to an output terminal and a drain coupled to ground, and an n-type transistor having a drain coupled to a junction of the n-type logic and voltage offset transistors, a gate coupled to the output terminal and a drain coupled to a voltage supply, wherein the feedback transistors are respectively selected according to the formulae:

$$Idsp = Gp*[(Va+Vthp)^2]*Wp/(2*Lp)$$

and $$Idsn = Gn*[(V_{DD}-Vb-Vthn)2]*Wn/(2*Ln)$$

where:

Idsp=the drain-to-source current of the p-type feedback transistor,
Vthp=threshold voltage of the p-type feedback transistor,
Wp=channel width of the p-type feedback transistor,
Lp=channel length of the p-type feedback transistor,
Va=the voltage at the source of the p-type feedback transistor,
Gp=the transconductance of the p-type feedback transistor,
Idsn=the drain-to-source current of the n-type feedback transistor,
Vthn=threshold voltage of the n-type feedback transistor,
Wn=channel width of the n-type feedback transistor,
Ln=channel length of the n-type feedback transistor,
Vb=the voltage at the source of the n-type feedback transistor, and
Gn=the transconductance of the n-type feedback transistor, to independently determine an up threshold and a down threshold of the input buffer circuit and thereby to provide an output signal having symmetrical hysteresis.

14. The input buffer circuit of claim 13, wherein the pull down circuit further comprises a second resistance path to ground through a second switch, the second switch being rendered conductive by a power on reset signal.

15. The input buffer circuit of claim 13, wherein all the transistors of the input buffer circuit are field effect transistors.

16. The input buffer circuit of claim 13 further comprising a plurality of pairs of feedback transistors, each pair of feedback transistors having a p-type feedback transistor and an n-type feedback transistor, each p-type feedback transistor having a drain coup ground through a switching circuit and each n-type feedback transistor having a drain coupled to the power supply through the switching circuit, wherein when the switching circuit associated with the respective pair of feedback transistors is activated the respective pair of feedback transistors supply a positive feedback to control a conductivity of the logic transistors and vary a voltage level on the output terminal.

17. The input buffer circuit of claim 16, wherein each switching circuit comprises a switching terminal connected to an n-type transistor and connected through an inverter to a p-type transistor, whereby a high logic signal applied to the switching terminal closes respective paths between the feedback transistors and power terminals supplying power to the input buffer circuit.

* * * * *